US011510329B2

(12) United States Patent
Leigh et al.

(10) Patent No.: US 11,510,329 B2
(45) Date of Patent: Nov. 22, 2022

(54) SCALABLE-BANDWIDTH AGGREGATION FOR RACK-SCALE SERVERS

(71) Applicant: HEWLETT PACKARD ENTERPRISE DEVELOPMENT LP, Houston, TX (US)

(72) Inventors: Kevin Leigh, Houston, TX (US); John Norton, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 448 days.

(21) Appl. No.: 16/192,454

(22) Filed: Nov. 15, 2018

(65) Prior Publication Data
US 2020/0163242 A1 May 21, 2020

(51) Int. Cl.
*H05K 5/02* (2006.01)
*H05K 5/00* (2006.01)
*H05K 7/14* (2006.01)

(52) U.S. Cl.
CPC ......... *H05K 5/0256* (2013.01); *H05K 5/0026* (2013.01); *H05K 5/0204* (2013.01); *H05K 7/1427* (2013.01); *H05K 7/1487* (2013.01); *H05K 7/1491* (2013.01)

(58) Field of Classification Search
None
See application file for complete search history.

(56) References Cited

U.S. PATENT DOCUMENTS 7,535,707 B2 * 5/2009 Seibold .................. G06F 1/188
361/679.49
10,048,451 B1 * 8/2018 Leigh ................... G02B 6/3898
10,492,324 B2 * 11/2019 Miura ................... H05K 5/0247
10,568,238 B1 * 2/2020 Leung ................. H05K 7/20736
10,694,635 B1 * 6/2020 Rivnay ................ H05K 7/1491
10,845,553 B2 * 11/2020 Zhao .................... H05K 1/0224
(Continued)

FOREIGN PATENT DOCUMENTS

WO WO-2017058232 4/2017
WO WO-2017200540 11/2017

OTHER PUBLICATIONS

"Networking,Cable,40GbE (QSFP+) to 4 × 10GbE SFP+ Passive Copper Breakout Cable, 5 Meters," Retrieved Sep. 24, 2018, https://www.dell.com/en-us/work/shop/dell-networkingcable40gbe-qsfp-to-4-x-10gbe-sfp-passive-copper-breakout-cable-5-meters/apd/470-aaxh/networking#polaris-pd>.
(Continued)

*Primary Examiner* — Xanthia C Cunningham
(74) *Attorney, Agent, or Firm* — McDermott Will & Emery

(57) ABSTRACT

Scalable-bandwidth aggregation boxes are disclosed that allow scalable electrical connection bandwidth of multiple servers in a rack to aggregation modules and compact bifurcatable optical cables to connect the aggregation modules to switches, while minimizing switch faceplate connector area requirements by using optical connectors. Users of a system including scalable-bandwidth aggregation boxes can choose a desired bandwidth cable to connect a server to a switch via an aggregation box. An aggregation box may include a scalable-bandwidth electrical connector on a faceplate, signal lines coupled between the scalable-bandwidth electrical connector and a board connector in the housing, and a serviceable bandwidth-aggregation module removably disposed in the housing.

20 Claims, 11 Drawing Sheets

(56) References Cited

U.S. PATENT DOCUMENTS

| | | | |
|---|---|---|---|
| 2003/0048999 A1* | 3/2003 | Imabayashi | G02B 6/4453 385/88 |
| 2005/0232565 A1* | 10/2005 | Heggestad | G02B 6/4452 385/135 |
| 2011/0026893 A1* | 2/2011 | Omori | G02B 6/4453 385/135 |
| 2012/0219263 A1* | 8/2012 | Beamon | G02B 6/3897 385/135 |
| 2013/0084050 A1* | 4/2013 | Vastmans | G02B 6/4448 385/135 |
| 2013/0102237 A1* | 4/2013 | Zhou | G06F 1/20 454/184 |
| 2014/0002988 A1* | 1/2014 | Roesner | H05K 7/1492 361/679.49 |
| 2014/0133086 A1* | 5/2014 | Chen | H05K 7/20145 361/679.33 |
| 2014/0228634 A1* | 8/2014 | Zimmon | A61B 1/00105 600/106 |
| 2014/0314385 A1* | 10/2014 | Miller | G02B 6/4452 385/135 |
| 2014/0369347 A1 | 12/2014 | Orsley | |
| 2015/0139598 A1* | 5/2015 | Barnes | G02B 6/445 385/135 |
| 2015/0185430 A1* | 7/2015 | Jin | G02B 6/4448 385/135 |
| 2015/0208543 A1* | 7/2015 | Chen | H05K 7/1489 361/679.39 |
| 2016/0073544 A1* | 3/2016 | Heyd | G06F 1/187 361/679.31 |
| 2017/0150621 A1* | 5/2017 | Breakstone | H05K 5/026 |
| 2018/0098455 A1* | 4/2018 | Ni | G06F 1/20 |
| 2018/0212377 A1* | 7/2018 | Zimmermann | H05K 7/1487 |
| 2018/0306990 A1* | 10/2018 | Badihi | G02B 6/4452 |
| 2019/0098788 A1* | 3/2019 | Leigh | H05K 7/1488 |

OTHER PUBLICATIONS

Ilya Krutov "Lenovo ThinkSystem NE10032 RackSwitch," Sep. 20, 2018, <https://lenovopress.com/lp0609-lenovo-thinksystem-ne10032-rackswitch>.

* cited by examiner

SCALABLE-BANDWIDTH AGGREGATION FOR RACK-SCALE SERVERS

BACKGROUND

This application generally relates to rack-scale servers, and more particularly to connection systems and methods for rack-scale servers.

Servers such as rack-scale servers are commonly coupled to a network by a switch. Some systems often use direct electrical or direct optical connections between servers and switches within a rack. These systems use fixed bandwidth electrical or optical cables that prevent scalable-bandwidth connections to the servers. Moreover, electrical cables can limit the distances between components, particularly for higher data rates, and implementing optical transceivers and cables for each server can be prohibitively expensive and complex.

The description provided in the background section should not be assumed to be prior art merely because it is mentioned in or associated with the background section. The background section may include information that describes one or more aspects of the subject technology.

BRIEF DESCRIPTION OF DRAWINGS

The accompanying drawings, which are included to provide further understanding and are incorporated in and constitute a part of this specification, illustrate disclosed embodiments and together with the description serve to explain the principles of the disclosed embodiments. In the drawings.

Figure 1:
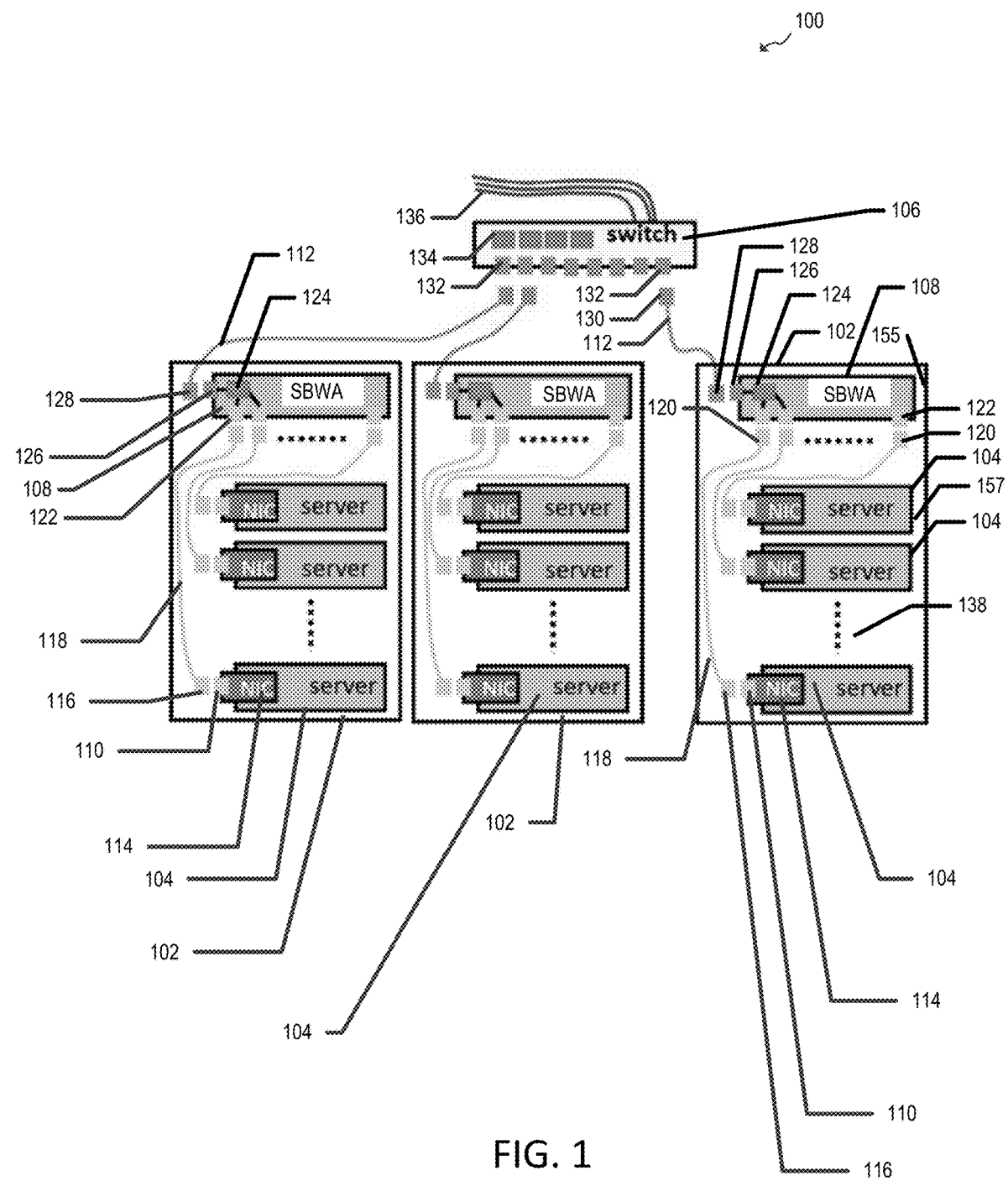
FIG. 1 illustrates a block diagram of an example architecture including scalable-bandwidth aggregation boxes, in accordance with various aspects of the disclosure.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

Connection systems and methods for rack-scale servers are disclosed. In systems in which servers are communicatively coupled to a network via one or more switches, switch port bandwidth and server port bandwidth can evolve differently, creating changing needs between systems and within systems for the cabling between the servers and the switch or switches. Accordingly, it would be desirable to be able to provide scalable-bandwidth connections between servers and switches.

As noted above, in some systems, fixed bandwidth electrical or optical cables prevent scalable-bandwidth connections to the servers.

In addition, electrical connectors on switch faceplates (e.g., for low-cost solutions) can limit switch port density, requiring the use of multiple switch boxes. Optical connectors can be provided on switch faceplates to help alleviate the switch port density problem, but supporting optical connections directly on servers may be cost prohibitive.

Aggregation boxes can be provided in some scenarios to alleviate the server-switch direct connection using electrical or optical cables for connectivity cost and switch faceplate congestion problems. However, using fixed bandwidth electrical and optical cables and bandwidth aggregation boxes can make a system less user-friendly and create cable clutter in racks to scale bandwidth connections between a server and an aggregation box, as well as between an aggregation box and a switch.

In some scenarios, aggregation may be provided using a port expander that includes multiple server-side downlink ports coupled, via signal processing circuitry, to a pluggable optical transceiver. This type of system can provide reduced costs, reduce cable clutter and complexity, regulate the line rate within a network interface card, and provide peer-to-peer communication among downlinks. However, if fixed bandwidth electrical connectors and/or cables are provided to connect the port expander to the servers and fixed bandwidth optical connectors and/or cables are provided to connect the port expander to a switch, scalable-bandwidth capabilities are still not provided.

In accordance with various aspects of the subject disclosure, scalable-bandwidth connection systems and methods for rack-scale servers are provided. The scalable-bandwidth connection systems may include a scalable-bandwidth aggregation box for installation in or on a rack for multiple servers. One or more servers can be installed in the rack and electrically coupled to the scalable-bandwidth aggregation box with, for example, flexible-bandwidth (e.g., bifurcatable) electrical cables. A scalable-bandwidth aggregation box may include one or more serviceable aggregation modules that convert electrical signals from a number of servers to optical signals (and vice versa). The converted optical signals may be optically coupled to one or more switches within the same rack or in other racks using, for example, flexible-bandwidth (e.g., bifurcatable) optical cables. A single rack may hold one or multiple scalable-bandwidth aggregation boxes.

The scalable-bandwidth aggregation boxes disclosed herein allow scalable electrical connection bandwidth of multiple servers in a rack, using low-cost bifurcatable electrical cables to connect to aggregation modules, and using compact bifurcatable optical cables to connect to switches, while minimizing switch faceplate connector real estate requirements by using optical connectors. Users of a system including scalable-bandwidth aggregation boxes can choose a desired bandwidth cable to connect a server to a switch via a scalable-bandwidth aggregation box.

Example System Architecture

FIG. 1 illustrates an example architecture 100 for scalable-bandwidth aggregation for rack-scale servers. The architecture 100 includes one or more server racks such as server racks 102, each having U-space 138 configured to receive multiple rack-scale servers such as servers 104. As shown in FIG. 1, each rack 102 includes a scalable-bandwidth aggregation (SBWA) box 108 mounted to the server rack. Scalable-bandwidth aggregation boxes 108 may be coupled between servers 104 and one or more switches, such as switch 106 for data networking.

Each scalable-bandwidth aggregation box 108 includes at least one scalable-bandwidth electrical connector 122, at least one scalable-bandwidth optical connector 126, and conversion circuitry 124 coupled between the scalable-bandwidth optical connector 126 and the at least one scalable-bandwidth electrical connector 122. As described in further detail hereinafter, the location of connectors 122 and 126 shown in FIG. 1 is merely illustrative and connectors 122 and 126 may be formed on a front-facing surface of scalable-bandwidth aggregation box 108. Scalable-bandwidth electrical connectors 122 may be disposed on a faceplate of scalable-bandwidth aggregation box 108. Scalable-bandwidth optical connectors 126 may be disposed on a module faceplate of an aggregation module that includes conversion circuitry 124.

The conversion circuitry 124 of scalable-bandwidth aggregation box 108 is configured to convert a first optical signal received (e.g., from switch 106) through the scalable-bandwidth optical connector 126 to a first electrical signal for transmission through the scalable-bandwidth electrical connector 122 (e.g., to one or more of servers 104). The conversion circuitry 124 of scalable-bandwidth aggregation box 108 is also configured to convert a second electrical signal received (e.g., from one or more of servers 104) through the scalable-bandwidth electrical connector 122 to a second optical signal for transmission through the scalable-bandwidth optical connector 126 (e.g., to switch 106). As described in further detail hereinafter, the conversion circuitry 124 of scalable-bandwidth aggregation box 108 may be formed to accept a serviceable aggregation module.

As shown in FIG. 1, multiple servers 104 that are mounted in the U-space may be coupled, via the scalable-bandwidth electrical connectors 122, to the scalable-bandwidth aggregation box 108. For example, electrical cables 118 may be provided to couple the servers 104 to the scalable-bandwidth electrical connectors 122. For example, each electrical cable 118 may include a first connector 116 that couples to a scalable bandwidth connector 110 for a server 104 (e.g., a connector of a network interface controller 114 for that server) and a second connector 120 that couples to a scalable-bandwidth electrical connector 122. As described in further detail hereinafter, each electrical cable 118 may be a bifurcated electrical wire having multiple branches coupled to the scalable-bandwidth electrical connector 122.

As shown in FIG. 1, switch 106 may be coupled, via one or more scalable-bandwidth optical connectors 126, to one or more scalable-bandwidth aggregation boxes 108. For example, optical cables 112 may be provided to couple the scalable-bandwidth optical connector 126 to switch 106. For example, each optical cable may include a first connector 128 that couples to the scalable-bandwidth optical connectors 126 and a second connector 130 that couples to a corresponding connector 132 at switch 106. As described in further detail hereinafter, scalable-bandwidth optical connectors 126 are bifurcatable optical connectors and optical cables 112 may be bifurcated optical cables having multiple branches coupled to the scalable-bandwidth optical connectors 126. As shown, switch 106 may include signal processing circuitry 134 and network cables 136 for coupling architecture 100 to an external network such as the internet and/or to one or more client devices of a network managed by servers 104.

In the example of FIG. 1, each scalable-bandwidth aggregation box 108 is mounted in a U-space 138 of a rack 102. A U-space, as used herein, may refer to an industry standard Electronic Industries Alliance (EIA) "rack unit" having the dimension of 1.75" in height. However, as described in further detail hereinafter, scalable-bandwidth aggregation boxes 108 can be mounted elsewhere on racks 102 such as on frame member that is interior to a sidewall surface 155 of a rack 102 such that scalable-bandwidth aggregation boxes 108 are mounted in an interior zero-U space 157 of a corresponding server rack.

Example Scalable-Bandwidth Aggregation Box

Figure 2:
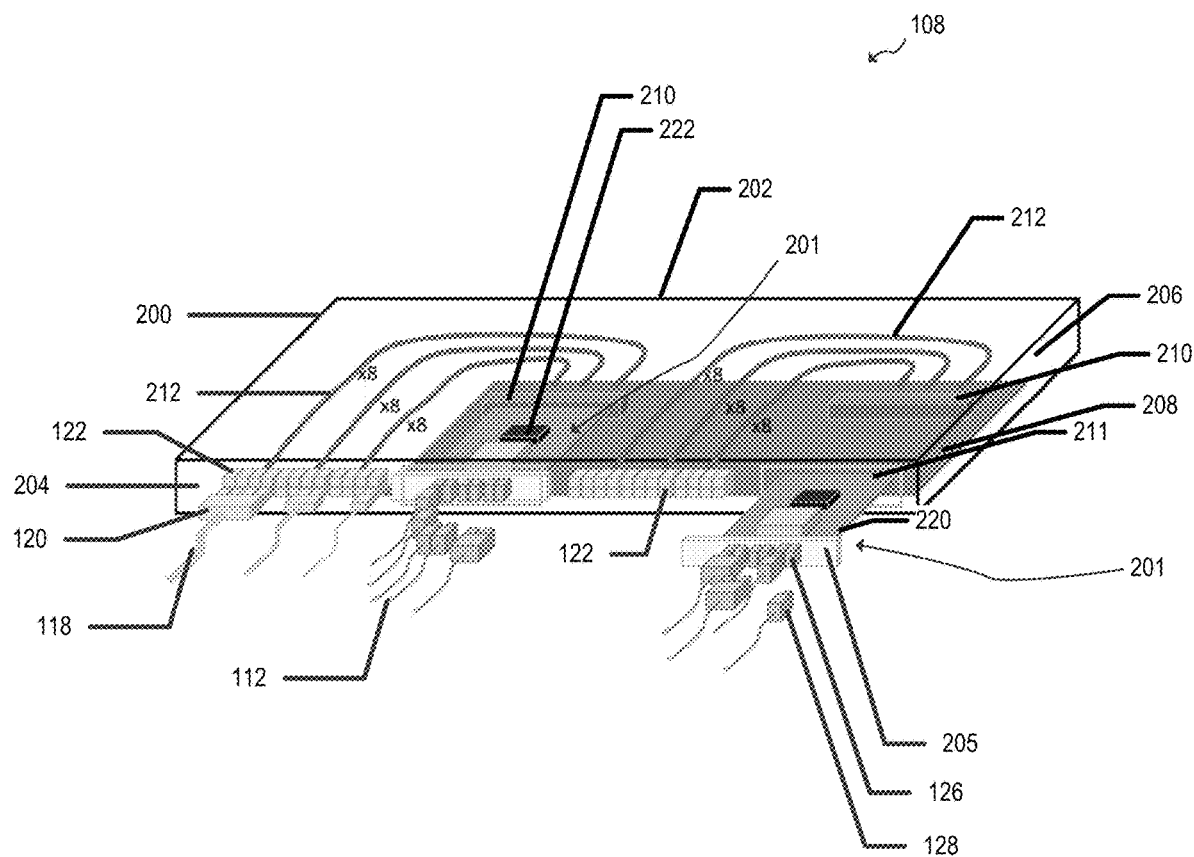
FIG. 2 illustrates a perspective view of an example scalable-bandwidth aggregation box, in accordance with various aspects of the disclosure.

FIG. 2 is a block diagram illustrating an example scalable-bandwidth aggregation box 108 that can be used in the architecture 100 of FIG. 1, according to certain aspects of the disclosure. As shown in FIG. 2, scalable-bandwidth aggregation box 108 may include a housing 200 having a faceplate 204, a body 202, and an attachment mechanism 206 for mounting the body 202 to a server rack, such as one of racks 102 of FIG. 1. As shown, scalable-bandwidth electrical connectors 122 may be formed on the faceplate 204.

A printed circuit board 208 may be disposed within the housing 200 and may have a first connector 210. In this example, first connector 210 is a card-edge connector that receives a module connector 211 (e.g., a mating card-edge of a module printed circuit board 220) of a serviceable bandwidth-aggregation module 201. As shown in FIG. 2, scalable-bandwidth aggregation box 108 includes signal lines 212 coupled between the scalable-bandwidth electrical connectors 122 on the faceplate 204 and the first connector 210.

The example of FIG. 2 shows scalable-bandwidth aggregation box 108 having two serviceable bandwidth-aggregation modules 201. In this example, the leftmost serviceable bandwidth-aggregation module 201 is fully installed (e.g., such that a module faceplate 204, on which scalable-bandwidth optical connectors 126 are disposed, is flush or in a parallel plane with faceplate 204 of housing 200) and the rightmost serviceable bandwidth-aggregation module 201 is partially removed from within the housing 200.

To install the partially removed serviceable bandwidth-aggregation module 201, serviceable bandwidth-aggregation module 201 may be slid into housing 200, such that the module printed circuit board 220 slides along guide rails (not explicitly shown) inside housing 200. The guide rails may lead serviceable bandwidth-aggregation module 201 into contact with connector 210, thereby allowing the module electrical interface 211 to connect with the connector 210. The module electrical interface 211 may be pressed into connection with connector 210, thereby securing serviceable bandwidth-aggregation module 201 in place.

To further secure serviceable bandwidth-aggregation module 201 through faceplate 204 to housing 200, one or more retention devices (e.g., screws, latches, or the like; not explicitly shown) may be coupled or otherwise removably connected to corresponding retention devices (e.g., threaded holes; not explicitly shown) of housing 200, if desired.

As shown in FIG. 2, serviceable bandwidth-aggregation modules 201 are configured to be removably disposed in the housing 200. Each serviceable bandwidth-aggregation module 201 may include a module faceplate 205, one or more scalable-bandwidth optical connector 126 on the module faceplate, a module connector 211 for coupling to the first connector 210, and conversion circuitry 222 coupled between the scalable-bandwidth optical connector 126 and the module connector 211. Conversion circuitry 222 may be an implementation of conversion circuitry 124 of FIG. 1. As noted above, conversion circuitry 222 is configured to convert a first optical signal received through a scalable-bandwidth optical connector 126 to a first electrical signal for transmission through a scalable-bandwidth electrical connector 122. Conversion circuitry 222 is also configured to convert a second electrical signal received through a scalable-bandwidth electrical connector 122 to a second optical signal for transmission through a scalable-bandwidth optical connector 126.

Conversion circuitry 222 may include, for example, one or more optical transceivers connected to one or more chip optical connectors, which are connected to multiple optical fiber jumpers that are respectively connected to multiple faceplate optical connectors 126. In this way, connectors 126 may form scalable-bandwidth optical connectors, or bifurcatable optical connectors, that can receive connectors 128 for cables of various bandwidths, as illustrated in FIG. 2. For example, when a two-fiber external optical cable 112 (e.g., a duplex cable) is used on each of the six faceplate optical connectors 126, one lane worth of bandwidth is used for a port signal transmission. However, when a four-fiber external optical cable is used by straddling two of the faceplate optical connectors 126, two lanes worth of bandwidth is used for a port signal transmission. Thus, six one-lane or three two-lane duplex cables may be supported by one serviceable bandwidth-aggregation module 201 in the example of FIG. 2. FIG. 2 specifically illustrates four (e.g., 200G) one-lane external optical cables 112 and one (e.g., 400G) two-lane external optical cable 112 for the leftmost serviceable bandwidth-aggregation module 201, and two one-lane external optical cables 112 and two two-lane external optical cables 112 for the rightmost serviceable bandwidth-aggregation module 201 (as an example). A 200G optical cable, as used herein, is a 200 Giga-bit per second (Gbps) cable in which four wavelengths may be multiplexed on a fiber, where each wavelength supports 50 Gbps data. Faster data rates are also contemplated in various examples.

As indicated in FIG. 2, electrical connectors 122 may also be implemented as bifurcatable connectors by providing multiple signal lines 212 (e.g., eight signal lines 212 in FIG. 2) between each bifurcatable electrical connector 122 and connector 210. FIG. 2 specifically illustrates one one-lane (e.g., 50G) external electrical cable 118 for a first bifurcatable electrical connector 122, one two-lane (e.g., 100G) external electrical cable 118 for a second bifurcatable connector 122, and one four-lane (e.g., 200G) external electrical cable 118 for a third bifurcatable electrical connector 122, associated with one serviceable bandwidth-aggregation module 201. In this way, scalable electrical connection bandwidth of multiple servers 104 can be provided using low-cost bifurcated electrical cables 118 to connect to aggregation modules 201 and compact bifurcatable optical cables 112 to connect to switches 106, while minimizing switch faceplate connector real estate by using optical connectors 126. A user of architecture 100 can selectively choose a desired bandwidth cable to connect a server 104 to a switch 106 via an aggregation box 108.

Conversion circuitry 222 may perform media conversion between electrical signals and optical signals. To facilitate this media conversion, conversion circuitry 222 may include an electrical transceiver, an optical transceiver, and a management controller, in some implementations. The electrical transceiver may facilitate transmission and reception of an electrical signal over an electrical signal line 212. The optical transceiver may facilitate transmission and reception of an optical signal through optical connectors 126. A management controller may perform and/or facilitate management (e.g., configuration, control, and monitoring) of signal conversion alone or in combination with a management controller remote with respect to serviceable bandwidth-aggregation module 201 (e.g., disposed elsewhere in scalable-bandwidth aggregation box 108, such as on printed circuit board 208). In some scenarios, a management controller for conversion circuitry 222 receives a management signal and manages the optical/electrical signal conversion based on the management signal. The management signal may be interfaced via a management cable to other system managers outside of a rack (not shown).

Conversion circuitry 222 may also include multi-link gearbox circuitry for performing multi-link gearbox functions for electrical and/or optical signals received by scalable-bandwidth aggregation box 108 (e.g., conversion circuitry 222 may support a modified version of the standard Optical Internetworking Forum (OIF) multi-link gearbox (MLG) protocol, as would be understood by one skilled in the art).

In various implementations, an aggregation box 108 may include one or more serviceable aggregation modules 201 to convert electrical signals from a number of servers 104 to optical signals (and vice versa). The converted optical signals may be optically coupled to one or multiple switches 106 within the same rack 102 or in other racks 102 using flexible-bandwidth (e.g., bifurcatable) optical cables. Each rack 102 may hold one or multiple aggregation boxes 108. Bifurcatable electrical connectors 122, bifurcatable optical connectors 126, and/or their associated cables can be shaped and electrically configured to an industry standard.

In the example of FIG. 2, each of signal lines 212 may be implemented as a twin-axial cable. However, it should also be appreciated that other implementations of signal lines 212 are possible, including signal lines 212 each formed by a trace on the printed circuit board 208, as shown in FIG. 3.

Figure 3:
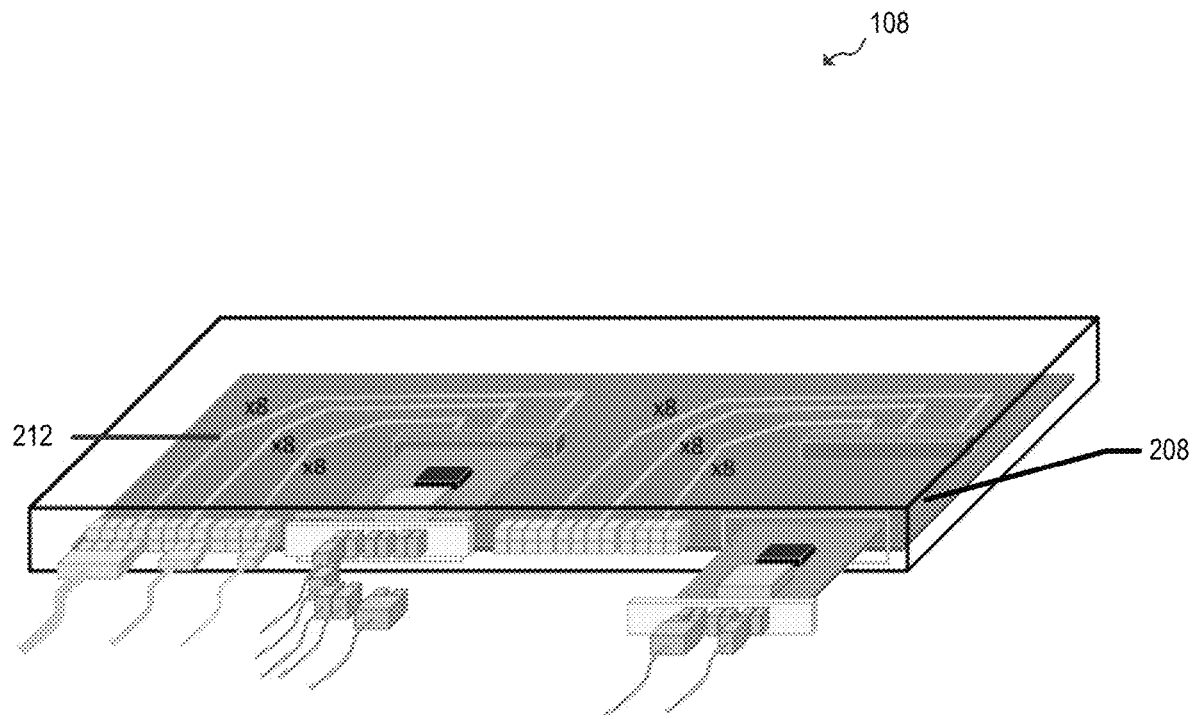
FIG. 3 illustrates a perspective view of another example scalable-bandwidth aggregation box, in accordance with various aspects of the disclosure.

In the examples of FIGS. 2 and 3, scalable-bandwidth aggregation box 108 is provided with serviceable bandwidth-aggregation modules 201 that have conversion circuitry 222 that handles substantially all of the management of optical and electrical signals through scalable-bandwidth aggregation box 108, and multiple connectors 210 for multiple serviceable bandwidth-aggregation modules 201 are provided on a common printed circuit board 208. However, it should be appreciated that other arrangements for scalable-bandwidth aggregation box 108 are contemplated.

Figure 4:
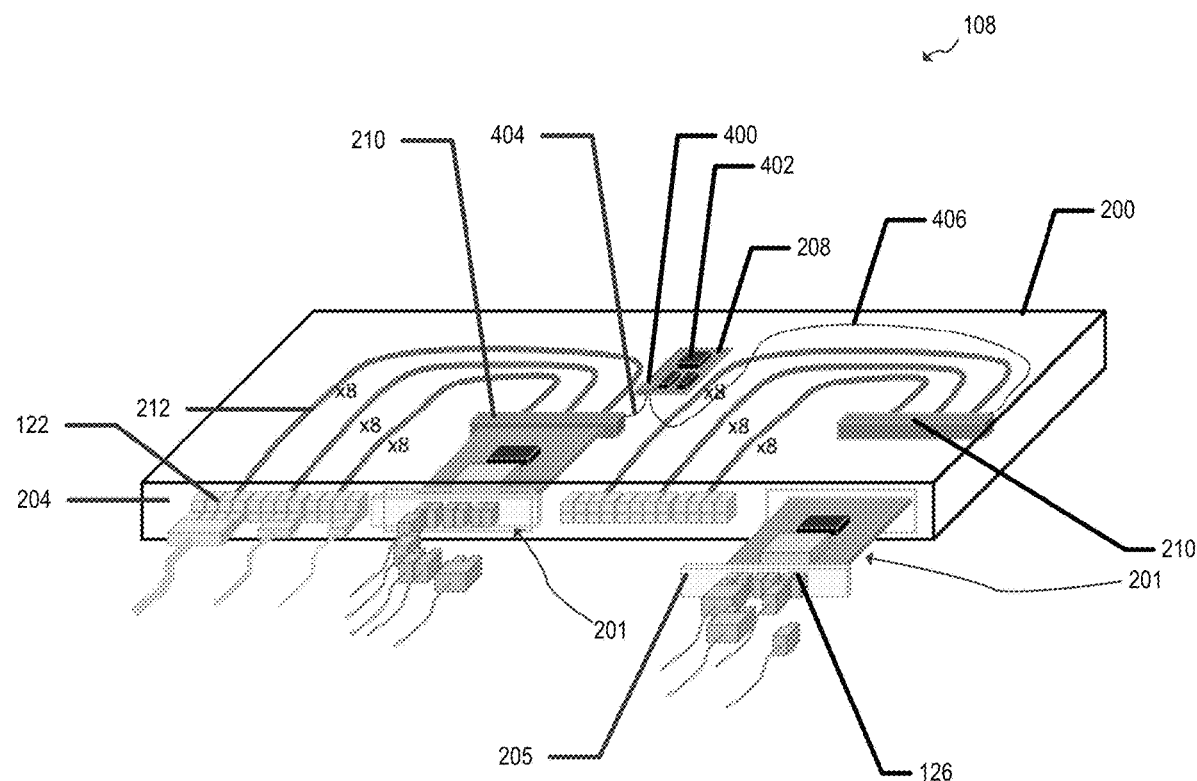
FIG. 4 illustrates a perspective view of yet another example scalable-bandwidth aggregation box, in accordance with various aspects of the disclosure.

For example, FIG. 4 shows an implementation of scalable-bandwidth aggregation box 108 in which connectors 210 are disposed separately within housing 200 from a control board formed from printed circuit board 208 and control and/or power circuitry 402 formed thereon. In the example of FIG. 4, aggregation box 108 includes a housing 200 having a faceplate 204 with one or more scalable-bandwidth electrical connectors 122. Aggregation box 108 also includes one or more first connectors 210, and a printed circuit board 208 disposed within the housing 200 and having a second connector 400 communicatively coupled to each of the first connectors 210. In this example, second connector 400 on printed circuit board 208 is communicatively coupled to two first connectors 210 via two corresponding electrical lines 404 and 406 between the first connectors and the second connector. The electrical lines 404 and 406 may contain electrical power and management signals.

In the arrangement shown in FIG. 4, multiple signal lines 212 are coupled between each set of the scalable-bandwidth electrical connectors 122 and a first connector 210. In this arrangement, serviceable bandwidth-aggregation modules 201 may be removably disposed in housing 200 and each serviceable bandwidth-aggregation module 201 includes a module faceplate 205 with one or more scalable-bandwidth optical connectors 126, a module connector 211 for coupling to a first connector 210, and conversion circuitry 222 coupled between the scalable-bandwidth optical connector and the module connector (e.g., as described above in connection with FIG. 2). Scalable-bandwidth connectors as described herein are scalable due to the different number of plugs that are provided to mate with a corresponding number of bays on a system.

Figure 5:
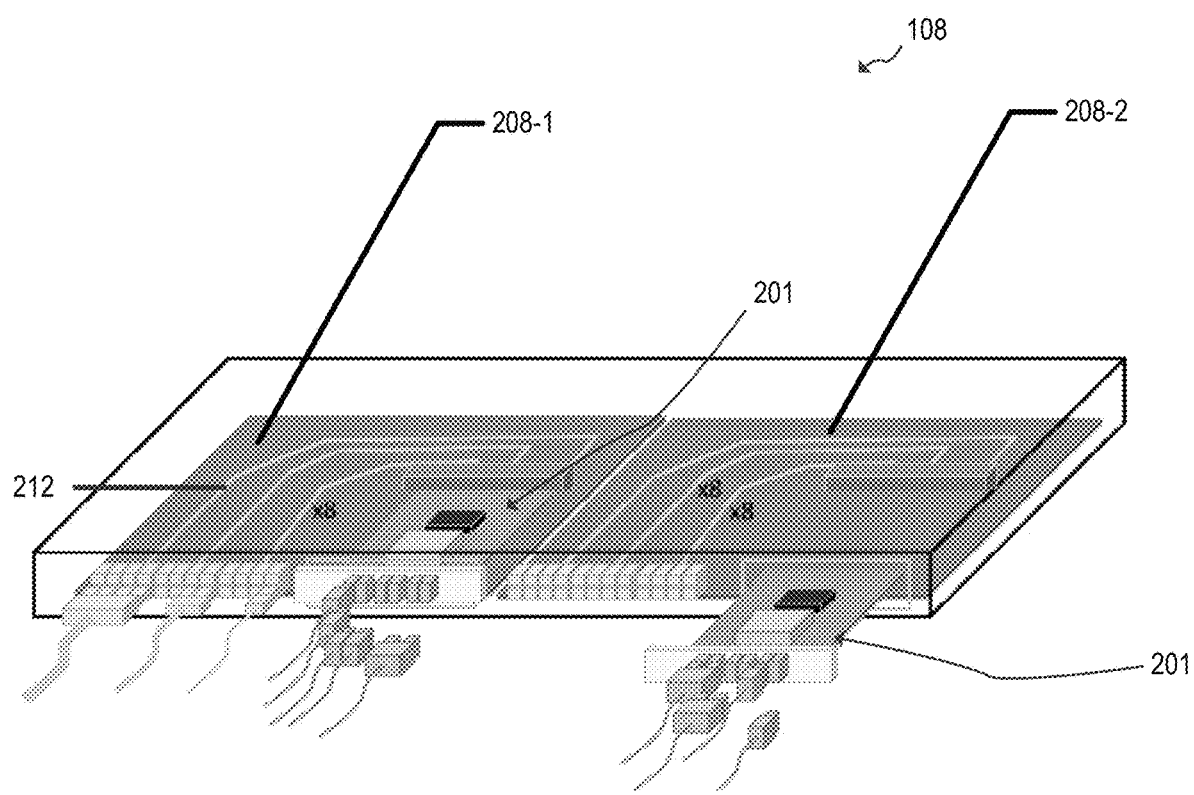
FIG. 5 illustrates a perspective view of still another example scalable-bandwidth aggregation box, in accordance with various aspects of the disclosure.

FIG. 5 shows another exemplary implementation of scalable-bandwidth aggregation box 108 in which each connector 210 is disposed on a separate printed circuit board 208-1 and 208-2 along with corresponding traces 212 between the connector 210 on that printed circuit board and a set of corresponding bifurcatable electrical connectors 122.

Figure 6:
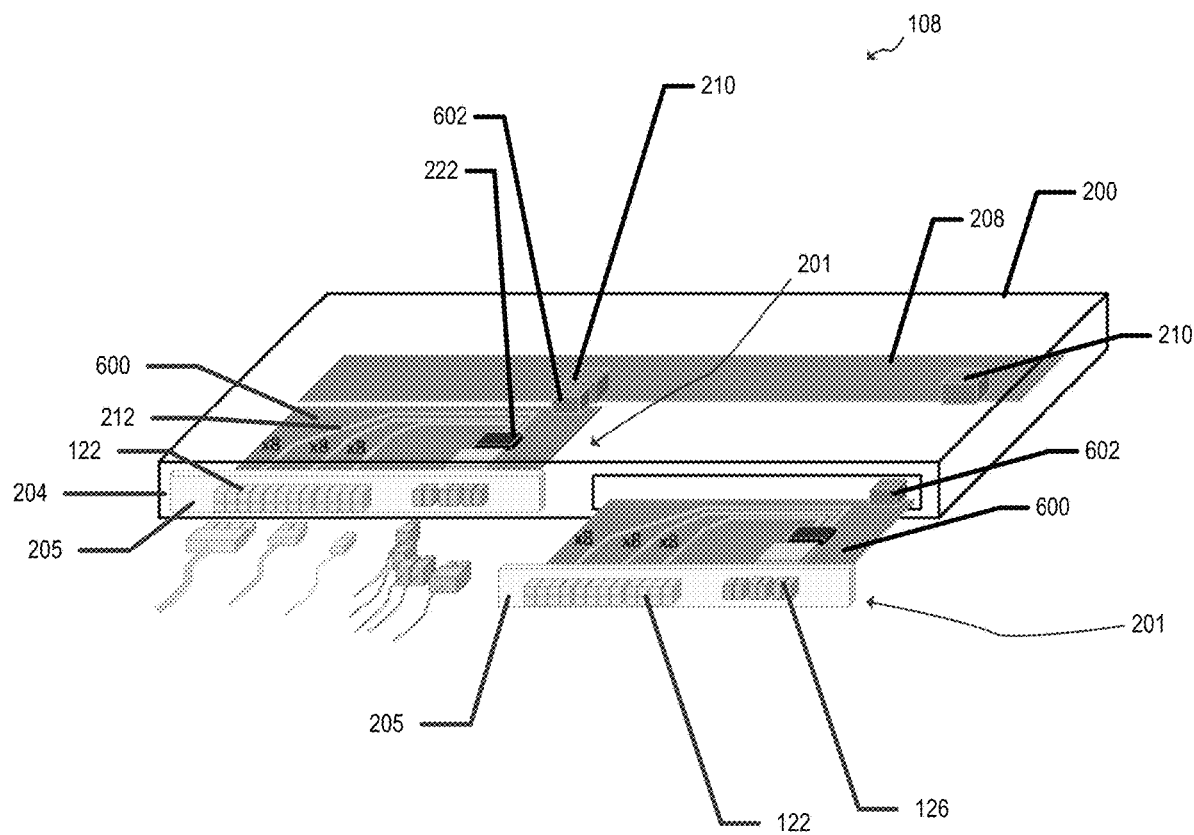
FIG. 6 illustrates a perspective view of an additional example scalable-bandwidth aggregation box, in accordance with various aspects of the disclosure.

FIG. 6 shows another exemplary implementation of scalable-bandwidth aggregation box 108. In the example of FIG. 6, scalable-bandwidth aggregation box 108 includes housing 200 and printed circuit board 208 disposed within the housing and having one or more first connectors 210. The scalable-bandwidth aggregation box 108 also includes one or more serviceable bandwidth-aggregation modules 201 removably disposed in the housing, each serviceable bandwidth-aggregation module including, in this implementation, a module faceplate 205 with one or more scalable-bandwidth optical connectors 126 and one or more scalable-bandwidth electrical connectors 122. In this example, each serviceable bandwidth-aggregation module 201 includes a module printed circuit board 600, a module connector 602 on the module printed circuit board for coupling to a corresponding first connector 210, conversion circuitry 222 on the module printed circuit board, and multiple signal lines 212 coupled between the scalable-bandwidth electrical connector 122 and the conversion circuitry 222. In this example, the signal lines 212 are implemented as traces on the module printed circuit board 600.

Figure 7:
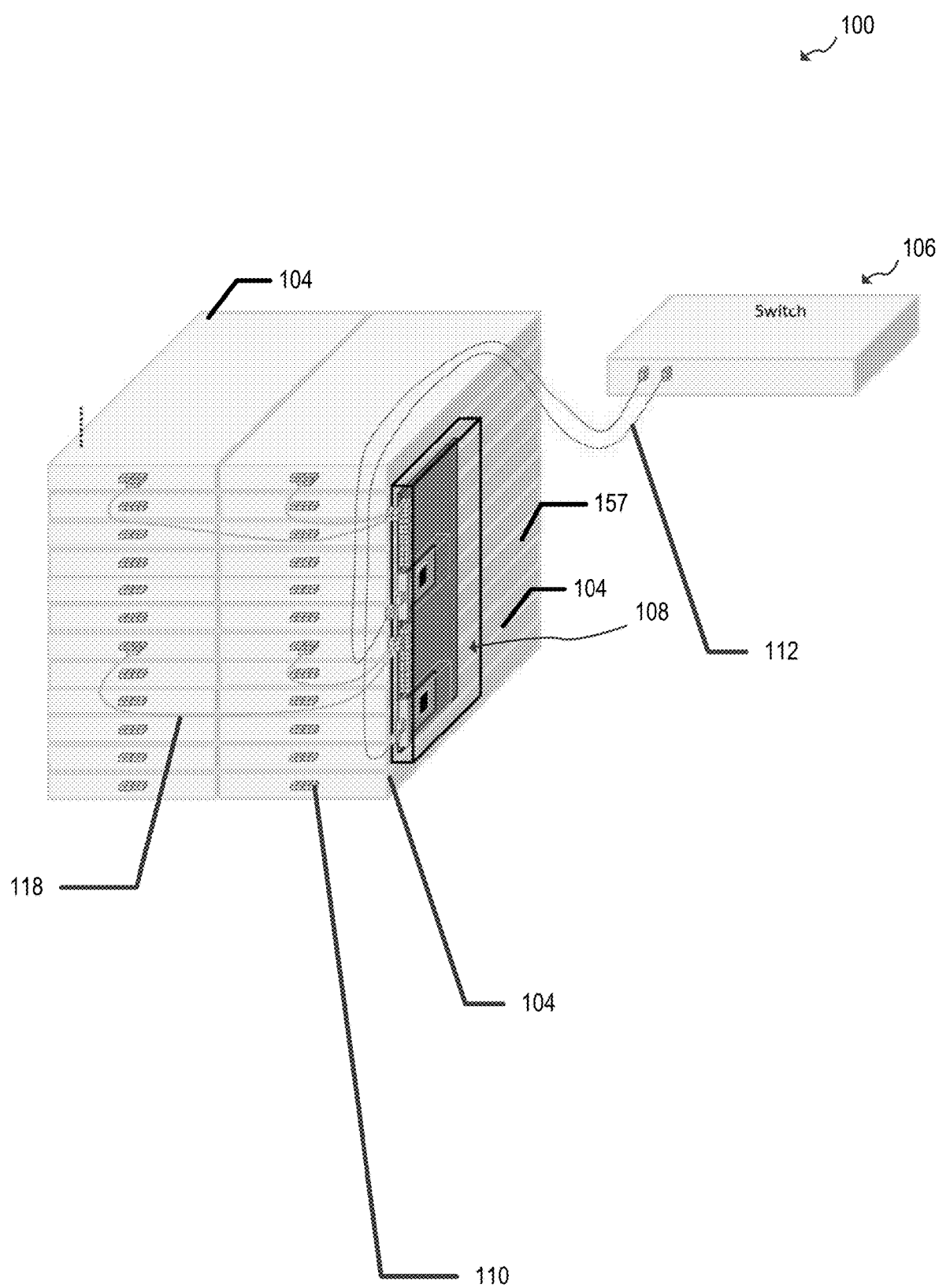
FIG. 7 illustrates a perspective view of a zero-U mounting arrangement for the scalable-bandwidth aggregation box shown in FIG. 2, in accordance with various aspects of the disclosure.
Figure 8:
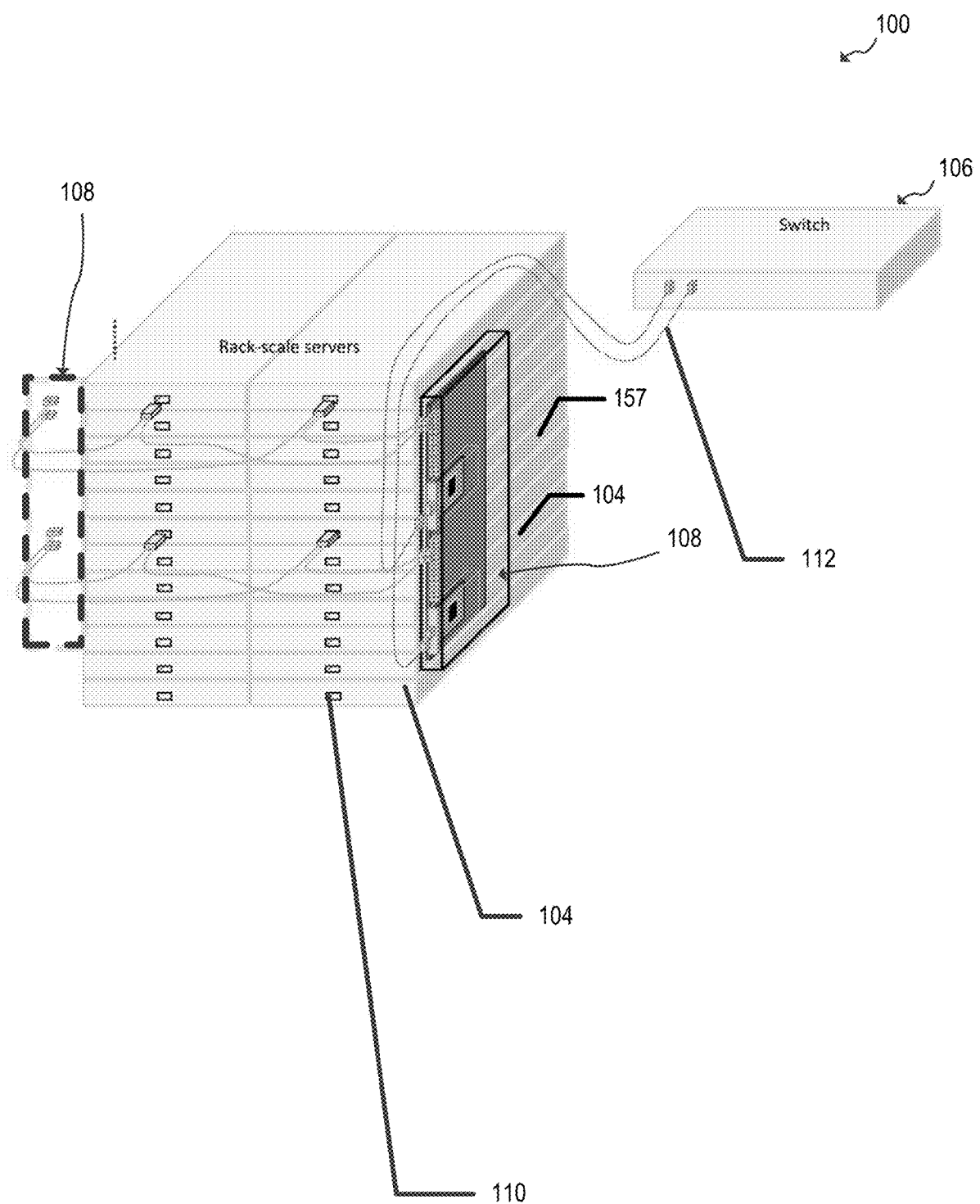
FIG. 8 illustrates a perspective view of a zero-U mounting arrangement for multiple scalable-bandwidth aggregation boxes in a single rack, in accordance with various aspects of the disclosure.
Figure 9:
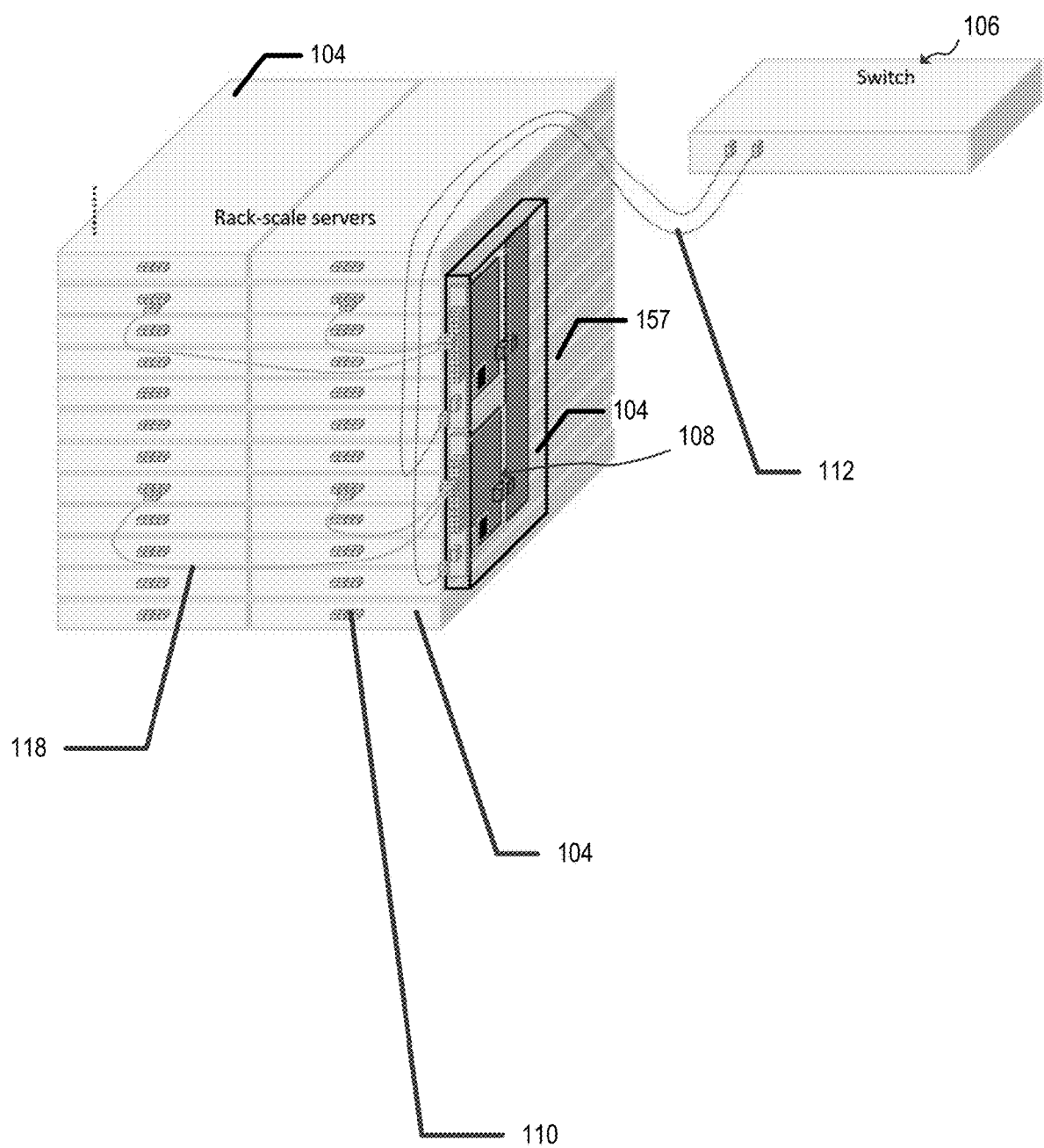
FIG. 9 illustrates a perspective view of a zero-U mounting arrangement for the scalable-bandwidth aggregation box shown in FIG. 6, in accordance with various aspects of the disclosure.

As noted above in connection with FIG. 1, one or more scalable-bandwidth aggregation boxes 108 can be mounted in the U-space 138 of a rack 102 or elsewhere on the rack. FIGS. 7, 8, and 9 show examples in which a scalable-bandwidth aggregation box 108 is mounted in an interior zero-U space of a rack 102 holding multiple servers 104.

Specifically, FIG. 7 shows an example, in which multiple servers 104 are electrically coupled (via electrical cables 118) to a scalable-bandwidth aggregation box 108 in the implementation of FIG. 2 that is mounted in zero-U space 157 (e.g., on an interior side frame) of a rack holding the servers (e.g., at the edges of the rack-mounted servers). Optical cables 112 connect the scalable-bandwidth aggregation box 108 to switch 106.

FIG. 8 shows how each of several rack-scale servers 104 may be coupled to two redundant scalable-bandwidth aggregation boxes 108 mounted in zero-U space 157 on opposing sides of one or more racks of the servers.

FIG. 9 shows an example in which multiple servers 104 are electrically coupled (via electrical cables 118) to a scalable-bandwidth aggregation box 108, in the implementation of FIG. 6, that is mounted in zero-U space 157 (e.g., on an interior sidewall) of a rack holding the servers (e.g., at the edges of the rack-mounted servers). However, it should be appreciated that any of the implementations of scalable-bandwidth aggregation box 108 described herein can be mounted within a U-space, within an internal zero-U space, or external to a rack. In this way, scalable bandwidth aggregation can be provided in which an aggregation box can use rack-U space or zero-U space, depending on power/management cabling and flexible-bandwidth electrical cable routing preferences.

The scalable-bandwidth aggregation boxes disclosed herein can allow a rack-scale configuration to remain the same (e.g., no intra-rack connection changes), while inter-rack connections can be varied (e.g., by using a scalable-bandwidth aggregation box 108 to switch connections to be single-home switch to dual-home switches).

Figure 10:
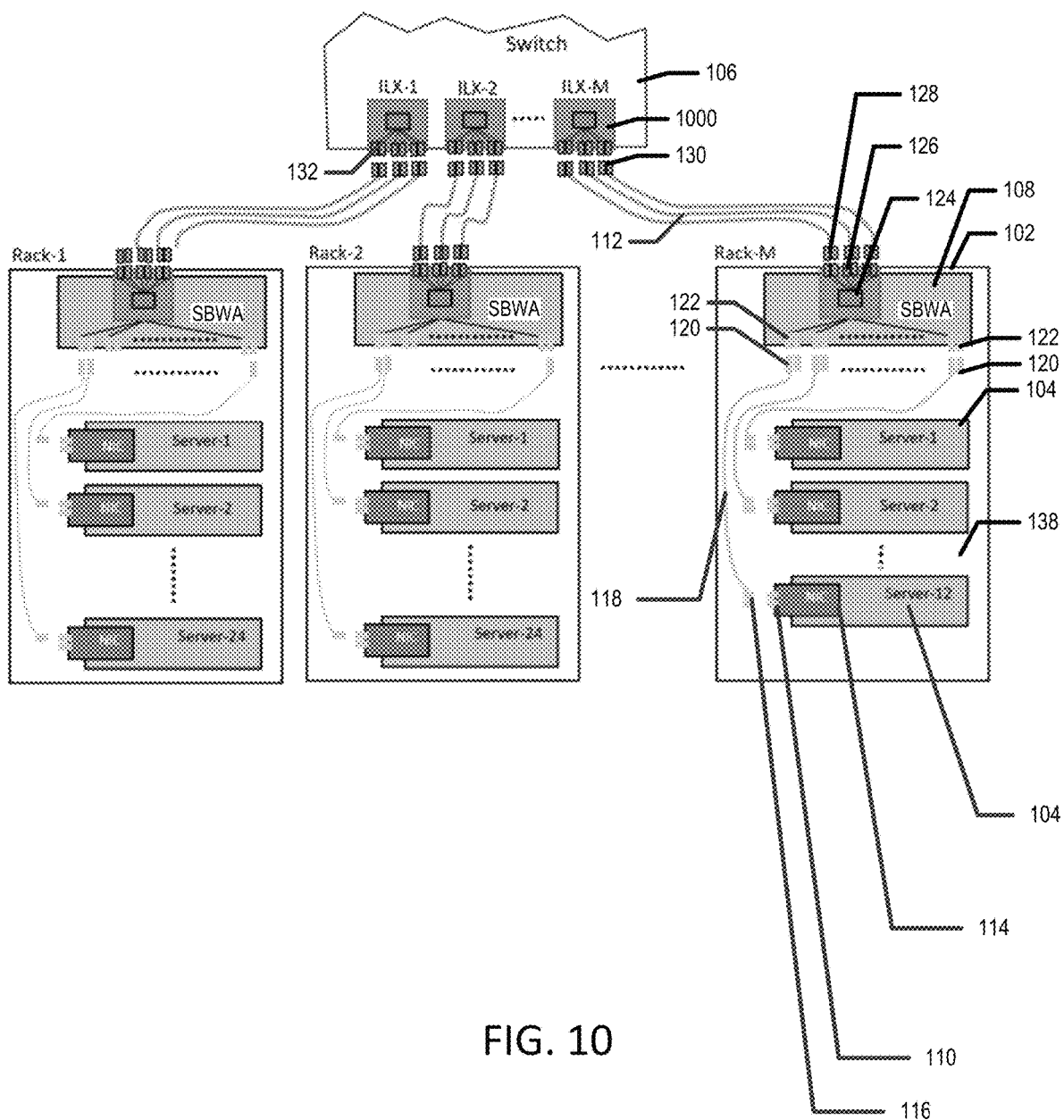
FIG. 10 illustrates an example system having a single switch and multiple scalable-bandwidth aggregation boxes for multiple racks, in accordance with various aspects of the disclosure.
Figure 11:
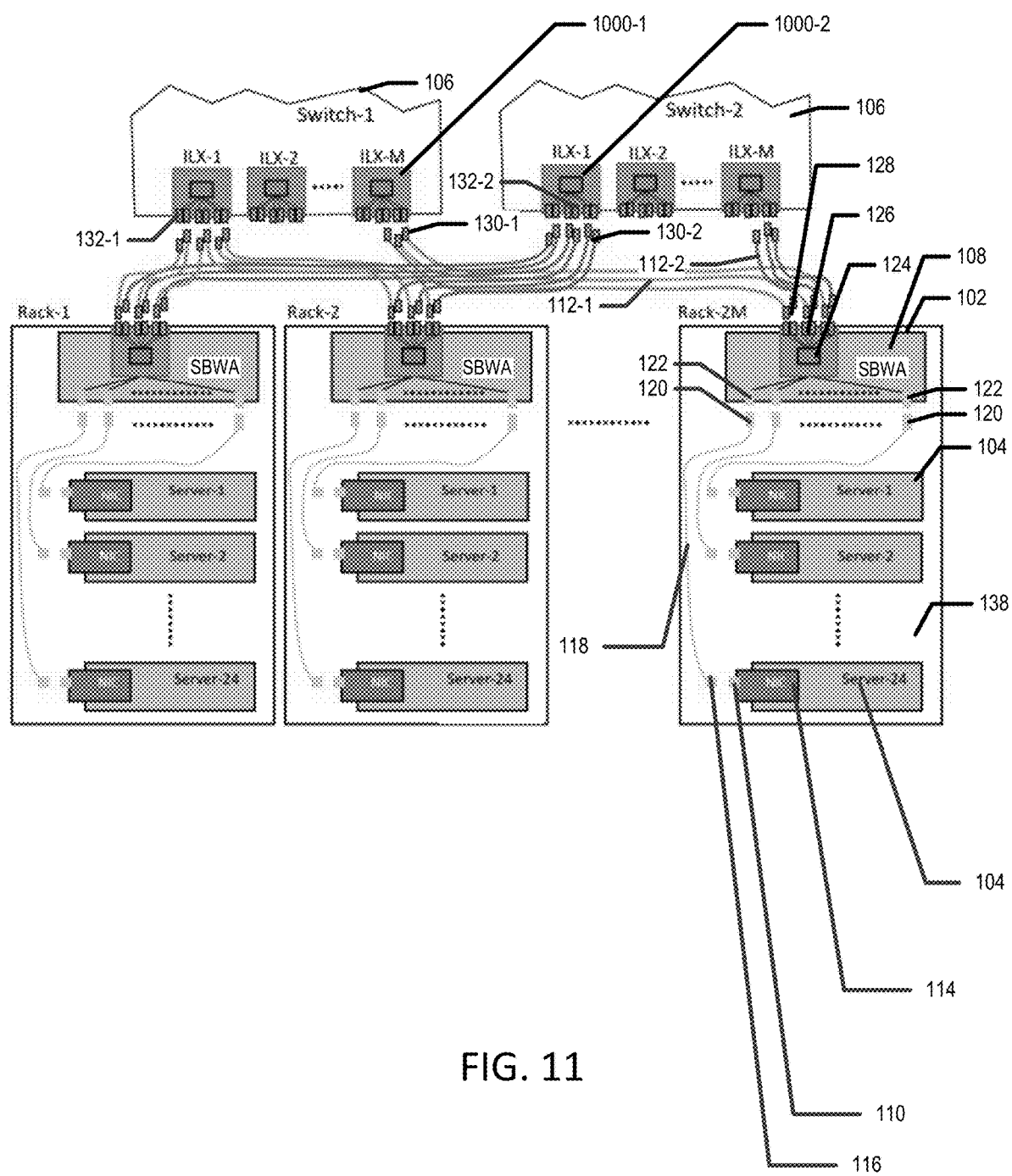
FIG. 11 illustrates an example system having multiple switches and multiple scalable-bandwidth aggregation boxes for multiple racks, in accordance with various aspects of the disclosure.

FIGS. 10 and 11 show example arrangements of architecture 100 that can be achieved using scalable-bandwidth aggregation boxes 108. In the example of FIG. 10, a single switch 106 is provided along with one scalable-bandwidth aggregation box 108 for each of M racks 102. In this example, one switch 106 connects to M racks with 24(M−1)+12 servers 104. This is because, in this illustrative example arrangement, racks 1 through M−1 each have 24 servers 104 and rack-M has 12 servers with 2× electrical bandwidth connections per server. However, it can be seen that, for rack M, the optical connection from scalable-bandwidth aggregation box 108 to switch 106 is the same as for the other racks with more servers. In this example, switch 106 includes multiple optical connection modules 1000.

FIG. 11 provides another example in which each rack 102 includes a scalable-bandwidth aggregation box 108 that is optically coupled to two switches (e.g., by optical cables 112-1 and 112-2). In this example, each switch 106 includes multiple optical connection modules 1000-1 and 1000-2. In this example, each switch 106 connects to 2M racks and thus 24*2M servers. It can be seen from the example of FIG. 11 that scalable-bandwidth aggregation boxes 108 allow flexible bandwidth allocation (e.g., bandwidth gearbox) and multi-link aggregation (similar to MLG), allowing reconfigurations of scalable-bandwidth aggregation box 108 connections to switch 106.

According to some aspects of the present disclosure, a scalable-bandwidth aggregation box for rack-scale servers is provided, the scalable-bandwidth aggregation box including a housing having a faceplate, a body, and an attachment mechanism for mounting the body to a server rack. The scalable-bandwidth aggregation box also includes a scalable-bandwidth electrical connector on the faceplate. The scalable-bandwidth aggregation box also includes a printed circuit board disposed within the housing and having a first connector. The scalable-bandwidth aggregation box also includes a plurality of signal lines coupled between the scalable-bandwidth electrical connector on the faceplate and the first connector. The scalable-bandwidth aggregation box also includes a serviceable bandwidth-aggregation module removably disposed in the housing. The serviceable bandwidth-aggregation module includes a module faceplate, a scalable-bandwidth optical connector on the module faceplate, a module connector for coupling to the first connector, and conversion circuitry coupled between the scalable-bandwidth optical connector and the module connector.

According to other aspects of the present disclosure, a system is provided that includes a server rack having U-space configured to receive a plurality of servers, and a scalable-bandwidth aggregation box mounted to the server rack. The scalable-bandwidth aggregation box includes a housing having a faceplate, a scalable-bandwidth electrical connector on the faceplate, a printed circuit board disposed within the housing and having a first connector, a plurality of signal lines coupled between the scalable-bandwidth electrical connector on the faceplate and the first connector, and a serviceable bandwidth-aggregation module removably disposed in the housing. The serviceable bandwidth-aggregation module includes a module faceplate, a scalable-bandwidth optical connector on the module faceplate, a module connector for coupling to the first connector, and conversion circuitry coupled between the scalable-bandwidth optical connector and the module connector.

According to other aspects of the present disclosure, an aggregation box for rack-scale servers is provided, the aggregation box including a housing having a faceplate with a scalable-bandwidth electrical connector, a first connector, a printed circuit board disposed within the housing and having a second connector communicatively coupled to the first connector, a plurality of signal lines coupled between the scalable-bandwidth electrical connector and the first connector, and a serviceable bandwidth-aggregation module removably disposed in the housing. The serviceable bandwidth-aggregation module includes a module faceplate with a scalable-bandwidth optical connector, a module connector for coupling to the first connector, and conversion circuitry coupled between the scalable-bandwidth optical connector and the module connector.

According to other aspects of the present disclosure, an aggregation box for rack-scale servers is provided, the aggregation box including a housing, a printed circuit board disposed within the housing and having a first connector, and a serviceable bandwidth-aggregation module removably disposed in the housing. The serviceable bandwidth-aggregation module includes a module faceplate with a scalable-bandwidth optical connector and a scalable-bandwidth electrical connector, a module printed circuit board, a module connector on the module printed circuit board for coupling to the first connector, conversion circuitry on the module printed circuit board, and a plurality of signal lines coupled between the scalable-bandwidth electrical connector and the conversion circuitry.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference. Furthermore, to the extent that the term "include," "have," or the like is used in the description or the claims, such term is intended to be inclusive in a manner similar to the term "comprise" as "comprise" is interpreted when employed as a transitional word in a claim.

The word "exemplary" is used herein to mean "serving as an example, instance, or illustration." Any embodiment described herein as "exemplary" is not necessarily to be construed as preferred or advantageous over other embodiments. Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." Pronouns in the masculine (e.g., his) include the feminine and neuter gender (e.g., her and its) and vice versa. The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for".

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A scalable-bandwidth aggregation box for rack-scale servers, the scalable-bandwidth aggregation box comprising:
    a housing comprising a faceplate, a body mountable to a server rack, guide rails, and an attachment mechanism for mounting the body to the server rack;
    a scalable-bandwidth electrical connector on the faceplate;
    a printed circuit board (PCB) disposed within the housing and comprising a first connector;
    a plurality of signal lines coupling the scalable-bandwidth electrical connector on the faceplate to the first connector; and
    a serviceable bandwidth-aggregation module removably disposed in the housing, wherein the serviceable bandwidth-aggregation module comprises:
        a module faceplate,
        a scalable-bandwidth optical connector on the module faceplate,
        a module connector for coupling to the first connector, and
        signal conversion circuitry that converts a first electrical signal to a corresponding first optical signal and couples the scalable-bandwidth optical connector to the module connector;
    wherein the serviceable bandwidth-aggregation module is disposed in the housing by sliding the serviceable bandwidth-aggregation module along the guide rails of the housing.

2. The scalable-bandwidth aggregation box of claim 1, wherein the signal conversion circuitry is configured to:
    convert a second optical signal received through the scalable-bandwidth optical connector to a corresponding second electrical signal for transmission through the scalable-bandwidth electrical connector;
    wherein convert the first electrical signal is received through the scalable-bandwidth electrical connector and the first optical signal is for transmission through the scalable-bandwidth optical connector.

3. The scalable-bandwidth aggregation box of claim 1, wherein, when the serviceable bandwidth-aggregation module is installed in the scalable-bandwidth aggregation box, the module faceplate is disposed in a parallel plane with the faceplate of the housing.

4. The scalable-bandwidth aggregation box of claim 1, wherein the attachment mechanism is configured to mount the body of the housing within a U-space of the server rack or in an interior zero-U space of the server rack.

5. The scalable-bandwidth aggregation box of claim 1, wherein the first connector comprises a card-edge connector.

6. The scalable-bandwidth aggregation box of claim 1, wherein the signal conversion circuitry is configured to support multi-link gearbox functionality.

7. The scalable-bandwidth aggregation box of claim 1, wherein each of the plurality of signal lines comprises a twin-axial cable or a trace on the PCB.

8. The scalable-bandwidth aggregation box of claim 1, wherein the serviceable bandwidth-aggregation module further comprises:
    a plurality of additional scalable-bandwidth optical connectors on the module faceplate; and
    a plurality of additional scalable-bandwidth electrical connectors on the faceplate.

9. The scalable-bandwidth aggregation box of claim 8, wherein each of the scalable-bandwidth optical connectors is a bifurcatable optical connector, and wherein each of the scalable-bandwidth electrical connectors is a bifurcatable electrical connector.

10. A system, comprising:
    a server rack configured to receive a plurality of servers; and
    a scalable-bandwidth aggregation box mounted to the server rack, the scalable-bandwidth aggregation box comprising:
        a housing having a faceplate and guide rails;
        a scalable-bandwidth electrical connector on the faceplate;
        a printed circuit board (PCB) disposed within the housing and comprising a first connector;
        a plurality of signal lines coupling the scalable-bandwidth electrical connector on the faceplate to the first connector; and
        a serviceable bandwidth-aggregation module removably disposed in the housing, wherein the serviceable bandwidth-aggregation module comprises:
            a module faceplate,
            a scalable-bandwidth optical connector on the module faceplate, a module connector for coupling to the first connector, and signal conversion circuitry that converts an electrical signal to a corresponding optical signal and couples the scalable-bandwidth optical connector to the module connector;

wherein the serviceable bandwidth-aggregation module is disposed in the housing by sliding the serviceable bandwidth-aggregation module along the guide rails of the housing.

11. The system of claim 10, further comprising at least one server of the plurality of servers mounted in a U-space of the server rack and coupled, via the scalable-bandwidth electrical connector, to the scalable-bandwidth aggregation box.

12. The system of claim 11, further comprising an electrical cable that couples the at least one server to the scalable-bandwidth electrical connector.

13. The system of claim 12, wherein the electrical cable is a bifurcated electrical cable having multiple branches coupled to the scalable-bandwidth electrical connector.

14. The system of claim 13, further comprising a switch coupled, via the scalable-bandwidth optical connector, to the scalable-bandwidth aggregation box.

15. The system of claim 14, further comprising an optical cable that couples the scalable-bandwidth optical connector to the switch.

16. The system of claim 15, wherein the optical cable is a bifurcated optical cable having multiple branches coupled to the scalable-bandwidth optical connector.

17. An aggregation box for rack-scale servers, the aggregation box comprising:
a housing comprising guide rails and a faceplate with a scalable-bandwidth electrical connector;
a first connector;
a printed circuit board (PCB) disposed within the housing and comprising a second connector communicatively coupled to the first connector;
a plurality of signal lines coupling the scalable-bandwidth electrical connector to the first connector; and
a serviceable bandwidth-aggregation module removably disposed in the housing, wherein the serviceable bandwidth-aggregation module comprises:
a module faceplate with a scalable-bandwidth optical connector,
a module connector for coupling to the first connector, and
signal conversion circuitry that converts an electrical signal to a corresponding optical signal and couples the scalable-bandwidth optical connector to the module connector;
wherein the serviceable bandwidth-aggregation module is disposed in the housing by sliding the serviceable bandwidth-aggregation module along the guide rails of the housing.

18. The aggregation box of claim 17, wherein the serviceable bandwidth-aggregation module further comprises a signal line between the first connector and the second connector.

19. An aggregation box for rack-scale servers, the aggregation box comprising:
a housing comprising guide rails;
a printed circuit board (PCB) disposed within the housing and comprising a first connector; and
a serviceable bandwidth-aggregation module removably disposed in the housing, wherein the serviceable bandwidth-aggregation module comprises:
a module faceplate with a scalable-bandwidth optical connector and a scalable-bandwidth electrical connector,
a module PCB,
a module connector on the module printed circuit board for coupling to the first connector,
signal conversion circuitry that converts an electrical signal to a corresponding optical signal and is on the module printed circuit board, and
a plurality of signal lines coupled between the scalable-bandwidth electrical connector and the signal conversion circuitry;
wherein the serviceable bandwidth-aggregation module is disposed in the housing by sliding the serviceable bandwidth-aggregation module along the guide rails of the housing.

20. The aggregation box of claim 19, wherein the plurality of signal lines comprise a plurality of traces on the module PCB.

* * * * *